United States Patent
Chong et al.

(10) Patent No.: US 6,335,253 B1
(45) Date of Patent: Jan. 1, 2002

(54) METHOD TO FORM MOS TRANSISTORS WITH SHALLOW JUNCTIONS USING LASER ANNEALING

(75) Inventors: Yung Fu Chong; Kin Leong Pey; Alex See; Andrew Thye Shen Wee, all of Singapore (SG)

(73) Assignees: Chartered Semiconductor Manufacturing Ltd.; National University of Singapore, both of Singapore (SG)

( * ) Notice: Subject to any disclaimer, the term of this patent is extended or adjusted under 35 U.S.C. 154(b) by 5 days.

(21) Appl. No.: 09/614,557

(22) Filed: Jul. 12, 2000

(51) Int. Cl.[7] .............................................. H01L 21/336
(52) U.S. Cl. ........................ 438/305; 438/528; 438/308
(58) Field of Search ................................. 438/305, 306, 438/307, 301, 299, 197, 308, 528

(56) References Cited

U.S. PATENT DOCUMENTS

| | | | | |
|---|---|---|---|---|
| 5,245,208 A | * | 9/1993 | Eimori ........................ 257/344 |
| 5,296,401 A | * | 3/1994 | Mitsui et al. ................ 438/231 |
| 5,602,045 A | * | 2/1997 | Kimura ....................... 438/305 |
| 5,885,886 A | * | 3/1999 | Lee ............................. 438/305 |
| 5,888,888 A | | 3/1999 | Talwar et al. ............... 438/533 |
| 5,908,307 A | | 6/1999 | Talwar et al. ............... 438/199 |
| 5,937,325 A | | 8/1999 | Ishida ......................... 438/655 |
| 5,953,615 A | | 9/1999 | Yu ............................... 438/303 |
| 5,956,603 A | | 9/1999 | Talwar et al. ............... 438/520 |
| 5,966,605 A | | 10/1999 | Ishida ......................... 438/299 |
| 5,998,272 A | | 12/1999 | Ishida et al. ................ 438/305 |
| 6,030,863 A | * | 2/2000 | Chang et al. ............... 438/306 |
| 6,063,682 A | * | 5/2000 | Sultan et al. ............... 438/528 |

* cited by examiner

Primary Examiner—Michael Trinh

(57) ABSTRACT

A new method of forming MOS transistors with shallow source and drain extensions and self-aligned silicide in the has been achieved. Gates are provided overlying a semiconductor substrate. Temporary sidewall spacers are formed on the gates. Ions are implanted into the semiconductor substrate and the polysilicon layer to form deep amorphous layers beside the spacers and shallow amorphous layers under the spacers. The spacers are removed. Ions are implanted to form lightly doped junctions in the shallower amorphous layer. Permanent sidewall spacers are formed on the gates. Ions are implanted to form heavily doped junctions in the deeper amorphous layer. A metal layer is deposited. A capping layer is deposited to protect the metal layer during irradiation. The integrated circuit device is irradiated with laser light to melt the amorphous layer while the crystalline polysilicon and semiconductor substrate remain in solid state. The metal layer is heated, and may be melted, to cause reaction with the silicon to form silicide. Ions in the heavily doped junctions and in the lightly doped junctions are also thereby diffused into the amorphous layer. The deep source and drain junctions, the shallow source and drain extensions, and a silicide layer are simultaneously formed. A heat treatment crystallizes the silicide to improve resistivity.

20 Claims, 13 Drawing Sheets

METHOD TO FORM MOS TRANSISTORS WITH SHALLOW JUNCTIONS USING LASER ANNEALING

BACKGROUND OF THE INVENTION (1) Field of the Invention

The invention relates to a method of fabricating semiconductor structures, and more particularly, to a method of forming MOS transistors with shallow junctions using laser annealing in the manufacture of an integrated circuit device.

(2) Description of the Prior Art

Sub-0.1 micron MOS technology requires the use of abrupt, ultra-shallow junctions for deep source and drains and for source and drain extensions. Traditional processing approaches have used ion implantation followed by rapid thermal annealing (RTA) to activate the implanted ions. RTA is used rather than a traditional thermal process to limit the thermal budget of the annealing process. However, RTA may not be capable for sub-0.1 micron technology because the RTA thermal ramp-up and ramp-down times are too large and can cause too much diffusion in the substrate. In addition, two RTA cycles are required: one to form the source and drain extension and one to form the deep source and drain.

RTA is also used in the art in the formation of silicide, particularly self-aligned silicide (salicide). A metal layer is first deposited overlying the integrated circuit. A RTA is performed to promote the reaction between the metal layer and silicon for the formation of silicide where the polysilicon gate and the source and drain junctions contact the metal layer. Once again, RTA may not be a capable process for sub-0.1 micron formation of silicide because of the large thermal budget. In addition, it is not possible to combine the RTA used for silicide formation with that used for source and drain junction activation.

Several prior art approaches disclose methods to form self-aligned silicide or to form source and drain junctions in the manufacture of integrated circuit devices. U.S. Pat. No. 5,953,615 to Yu teaches a method to form deep source and drain junctions and shallow source and drain extensions in a single process. Spacers are formed. An ion beam is used to amorphize the silicon to two different depths. Spacers are removed and not reformed. A single dopant implantation is performed. U.S. Pat. No. 5,888,888 to Talwar et al discloses a method to form silicide. Amorphous regions are formed in the polysilicon gate and in the substrate. A metal layer is then deposited. Laser light is used to form silicide. The metal layer is explicitly not melted by the laser light. A thermal anneal is then performed to crystallize the silicide. No capping layer is used during silicidation. U.S. Pat. No. 5,998,272 to Ishida et al teaches a method to form a MOSFET with deep source and drain junctions and shallow source and drain extensions. Sidewall spacers are removed after formation of source and drain junctions and salicide. A laser doping process is used in one embodiment. U.S. Pat. No. 5,937,325 to Ishida discloses a method to form silicide on an MOS gate. A titanium layer is deposited. A laser anneal is performed to form silicide. After removing unreacted metal, an RTA is performed to decrease the resistivity of the silicide. U.S. Pat. No. 5,908,307 to Talwar et al teaches a method to form MOS transistors with ultra-shallow junctions. After a pre-amorphizing ion implantation, a projection gas immersion laser doping (P-GILD) process is used to deposit the junctions. U.S. Pat. No. 5,956,603 to Talwar et al discloses a method to form shallow junction MOS transistors. Amorphous regions are ion implanted and then laser annealed. The deep source and drain junctions are annealed separately from the shallow extension junctions. The deep junctions and the shallow extension junctions are formed in separate process step. U.S. Pat. No. 5,966,605 to Ishida teaches a method to form a transistor. An ion implant is performed to dope the gate and the source and drain regions. A laser anneal is performed on the polysilicon gate but the unactivated ions do not diffuse in the source and drain regions. An RTA is then performed to activate the source and drain ions.

SUMMARY OF THE INVENTION

A principal object of the present invention is to provide an effective and very manufacturable method to form MOS transistors in the manufacture of an integrated circuit device.

A further object of the present invention is to form shallow source and drain extensions using a laser anneal.

Another further object of the present invention is to form deep source and drain junctions using a laser anneal.

A still further object of the present invention is to simultaneously form shallow source and drain extensions and deep source and drain junctions using a single laser anneal.

Another further object of the present invention is to form self-aligned silicide on the gate, drain, and source of an MOS transistor using a laser anneal.

A still further object of the present invention is to simultaneously form shallow source and drain extensions and self-aligned silicide on the gate, drain, and source of an MOS transistor using a single laser anneal.

In accordance with the objects of this invention, a new method of forming MOS transistors with shallow source and drain extensions and deep source and drain junctions in the manufacture of an integrated circuit device has been achieved. Gates are provided overlying a semiconductor substrate. Each gate comprises a gate oxide layer overlying the semiconductor substrate and a polysilicon layer overlying the gate oxide layer. Temporary sidewall spacers are formed on the gates. The temporary sidewall spacers are over etched to achieve a selected sidewall width. Ions are implanted into the exposed semiconductor substrate to form an amorphous layer. A deeper amorphous layer forms adjacent to the spacers while a shallower amorphous layer forms under the spacers. The temporary sidewall spacers are removed. Ions are implanted into the exposed semiconductor substrate to form lightly doped junctions in the shallower amorphous layer. Permanent sidewall spacers are formed on the gates. Ions are implanted into the semiconductor substrate to form heavily doped junctions in the deeper amorphous layer. A capping layer is deposited overlying the semiconductor substrate and the gates to protect the semiconductor substrate during irradiation. The semiconductor substrate is irradiated with laser light to melt the amorphous layer while the crystalline regions of the semiconductor substrate remain in solid state. Ions in the heavily doped junctions diffuse in the deeper amorphous layer and in the lightly doped junctions diffuse in the shallower amorphous layer. The deep source and drain junctions and the shallow source and drain extensions for the transistors are thereby simultaneously formed. The capping layer is removed to complete the MOS transistors in the manufacture of the integrated circuit device.

Also in accordance with the objects of this invention, a new method of forming MOS transistors with shallow source and drain extensions and deep source and drain junctions in the manufacture of an integrated circuit device has been achieved. Gates are provided overlying a semiconductor substrate. Each gate comprises a gate oxide layer overlying the semiconductor substrate and a polysilicon layer overlying the gate oxide layer. Ions are implanted into the exposed semiconductor substrate to form shallower amorphous layer. Ions are implanted into the exposed semiconductor substrate to form lightly doped junctions in the shallower amorphous layer. Sidewall spacers are formed on the gates. Ions are implanted into the exposed semiconductor substrate to form a deeper amorphous layer. Ions are implanted into the semiconductor substrate to form heavily doped junctions in the deeper amorphous layer. A capping layer is deposited overlying the semiconductor substrate and the gates to protect the semiconductor substrate during irradiation. The semiconductor substrate is irradiated with laser light to melt the amorphous layer while the crystalline regions of the semiconductor substrate remain in solid state. Ions in the heavily doped junctions diffuse in the deeper amorphous layer and in the lightly doped junctions diffuse in the shallower amorphous layer. The deep source and drain junctions and the shallow source and drain extensions for the transistors are thereby simultaneously formed. The capping layer is removed to complete the MOS transistors in the manufacture of the integrated circuit device.

Also in accordance with the objects of this invention, a new method of forming MOS transistors with shallow source and drain extensions and self-aligned silicide in the manufacture of an integrated circuit device has been achieved. Gates are provided overlying a semiconductor substrate. Each gate comprises a gate oxide layer overlying the semiconductor substrate and a polysilicon layer overlying the gate oxide layer. Temporary sidewall spacers are formed on the gates. The temporary sidewall spacers are over etched to achieve a selected sidewall width. Ions are implanted into the exposed semiconductor substrate and the exposed polysilicon layer to form an amorphous layer in the semiconductor substrate and the polysilicon layer. A deeper amorphous layer forms adjacent to the spacers while a shallower amorphous layer forms underlying the spacers. The temporary sidewall spacers are removed. Ions are implanted into the exposed semiconductor substrate to form lightly doped junctions in the shallower amorphous layer. Permanent sidewall spacers are formed on the gates. Ions are implanted into the semiconductor substrate to form heavily doped junctions in the deeper amorphous layer. A metal layer is deposited overlying the semiconductor substrate and the gates. A capping layer is deposited overlying the metal layer to protect the metal layer during irradiation. The semiconductor substrate, the metal layer, and the polysilicon layer are irradiated with laser light to melt the amorphous layer while the polysilicon layer and the crystalline regions of the semiconductor substrate remain in solid state. The metal layer is heated and may be melted depending on the laser fluence. Ions in the heavily doped junctions and in the lightly doped junctions are thereby diffused into the amorphous layer. The deep source and drain junctions, the shallow source and drain extensions, and a silicide layer overlying the gates and the deep source and drain junctions for the transistors are thereby simultaneously formed. The silicon body is then subjected to a heat treatment to convert the silicide layer into highly crystalline silicide of desired resistivity. The capping layer and the metal layer are removed to complete the MOS transistors in the manufacture of the integrated circuit device.

BRIEF DESCRIPTION OF THE DRAWINGS

In the accompanying drawings forming a material part of this description, there is shown.

DESCRIPTION OF THE PREFERRED EMBODIMENTS

The embodiments disclose the application of the present invention to the formation of MOS transistors with shallow junctions in the manufacture of an integrated circuit device. The present invention is applied in two preferred embodiments to the formation of MOS transistors with shallow source and drain extensions and deep source and drain junctions. The shallow source and drain extensions and deep source and drain junctions are annealed simultaneously by a single laser anneal. In a third embodiment, the shallow source and drain extensions and deep source and drain junctions are annealed simultaneously with the formation of self-aligned silicide. Herein, a single laser anneal is used to form the junctions and the silicide. It should be clear to those experienced in the art that the present invention can be applied and extended without deviating from the scope of the present invention.

Figure 1:
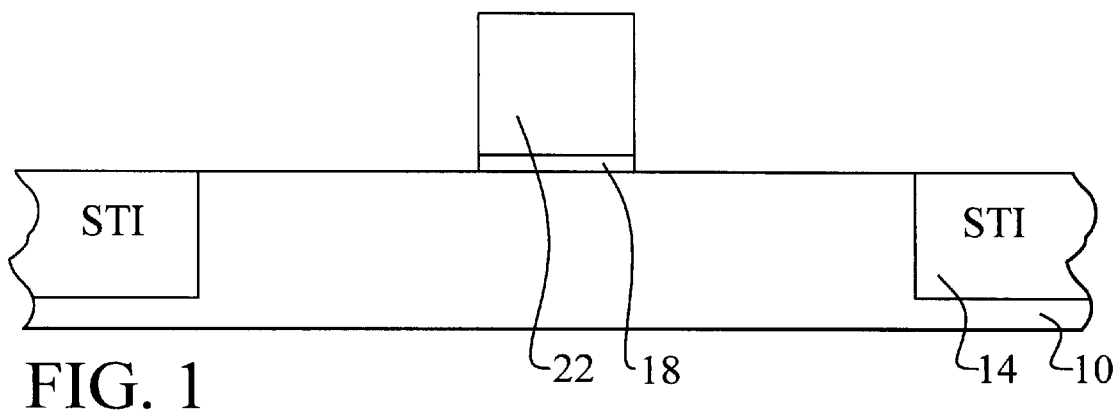
FIGS. 1 through 13 schematically illustrate in cross-sectional representation a first preferred embodiment of the present invention.

Referring now particularly to FIG. 1, there is shown a cross-sectional representation of the first preferred embodiment of the present invention. A semiconductor substrate 10 is provided. The semiconductor substrate 10 preferably comprises monocrystalline silicon. Shallow trench isolations (STI) 14 are formed in the semiconductor substrate 10 to define the active regions of the integrated circuit device. Alternatively, field oxide regions, formed using a local oxidation of silicon (LOCOS) technique, could be used in place of the STI regions 14.

A transistor gate is formed overlying the semiconductor substrate 10 by conventional methods. For example, a gate oxide layer 18 is formed overlying the semiconductor substrate 10. The gate oxide layer 18 preferably comprises silicon dioxide that may be formed by thermal oxidation or by chemical vapor deposition (CVD). The gate oxide layer 18 of the preferred embodiment is formed to a thickness of between about 10 Angstroms and 150 Angstroms.

A polysilicon layer 22 is deposited overlying the gate oxide layer 18. The polysilicon layer 22 will form the gate for the transistor. The polysilicon layer 22 is deposited using, for example, a low-pressure chemical vapor deposition (LPCVD) process. The polysilicon layer 22 is preferably deposited to a thickness of between about 500 Angstroms and 2,500 Angstroms.

The polysilicon layer 22 and the gate oxide layer 18 are patterned to form the gates for the transistors. The patterning step may be performed using a conventional photolithographic mask and etch sequence. In this scheme, a photoresist material is deposited overlying the polysilicon layer 22. The photoresist material is exposed to light through a patterned mask and then developed. The remaining photoresist forms a surface mask which allows the polysilicon layer 22 and the gate oxide layer 18 to be selectively etched away. The remaining photoresist layer is then stripped.

Figure 2:
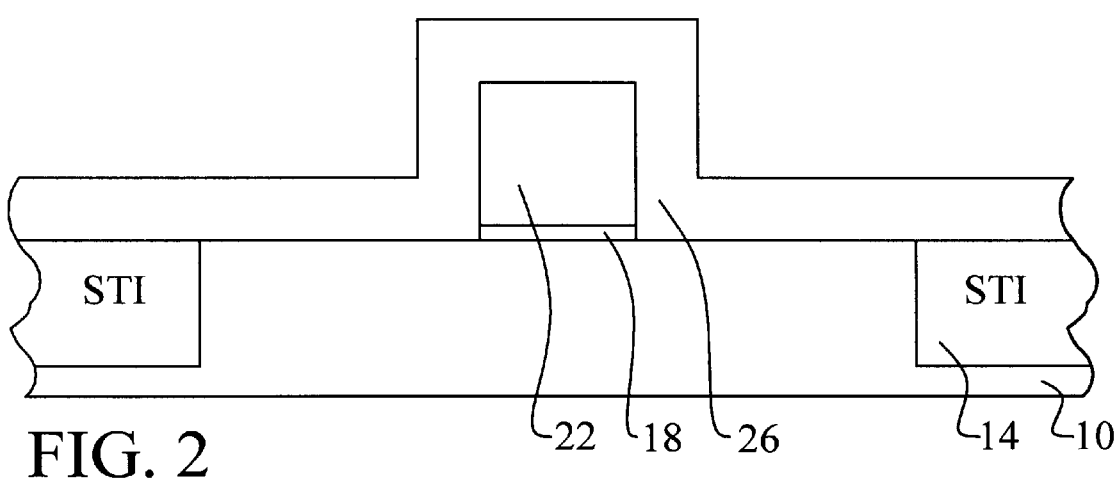

Referring now to FIG. 2, a dielectric layer 26 is deposited overlying the semiconductor substrate 10 and the gate 22. The dielectric layer 26 will be later etched to form a temporary sidewall spacer on the gate 22. The dielectric layer 26 preferably comprises silicon dioxide that is deposited by a chemical vapor deposition (CVD) process. The dielectric layer 26 is deposited to a thickness of between about 200 Angstroms and 1,500 Angstroms.

Figure 3:
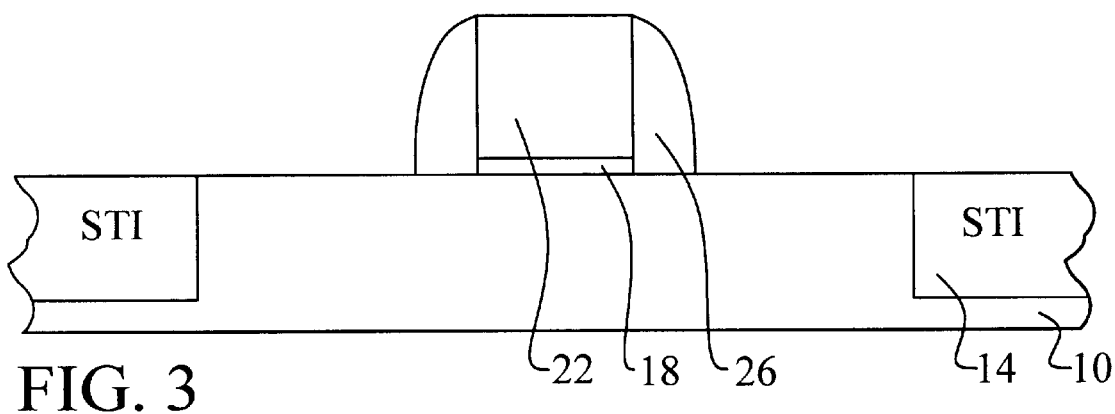

Referring now to FIG. 3, the dielectric layer 26 is anisotropically etched to form temporary sidewall spacers 26 on the gate 22.

Figure 4:
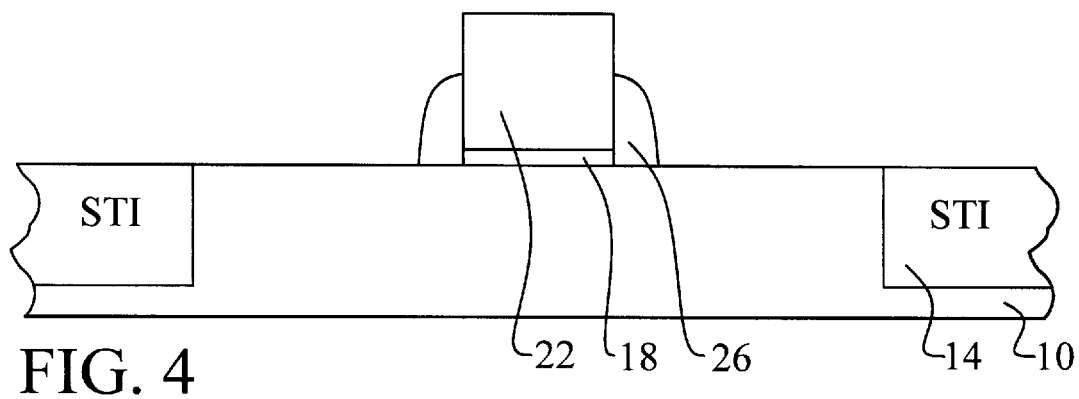

Referring now to FIG. 4, the temporary sidewall spacers 26 are over-etched to achieve a selected sidewall width. This step is important to the present invention because it provides additional process margin for the later formation of the amorphous layer in the semiconductor substrate 10. The over-etching may be performed in the same etching process used to form the temporary sidewall spacers 26. The selected width of the temporary sidewall spacers 26 is between about 200 Angstroms and 3,000 Angstroms.

Figure 5:
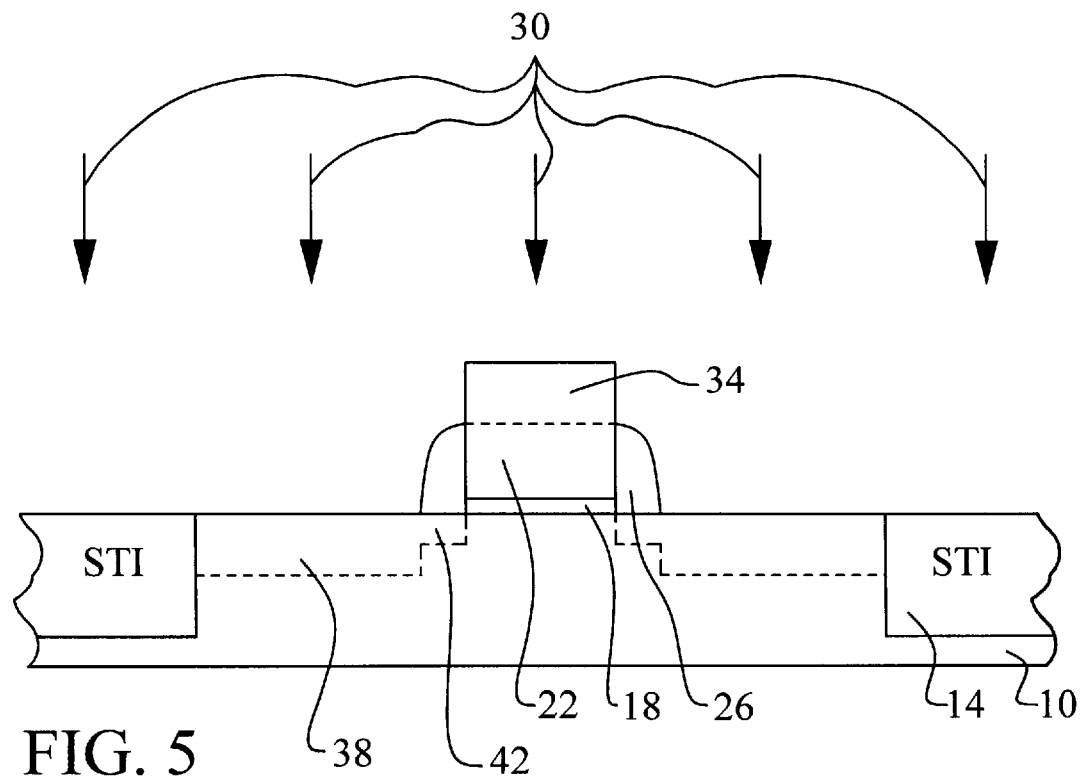

Referring now to FIG. 5, an important step in the method of the present invention is illustrated. Ions are implanted 30 into the exposed semiconductor substrate 10 to form an amorphous layer 38 and 42 in the semiconductor substrate 10. Preferably, Si, Ge, or Ar ions are implanted to break lattice bonds and create a non-crystalline or amorphous silicon layer in the semiconductor substrate 10. By carefully selecting the weight of the ion and the implantation energy, an amorphous layer 38 and 42 can be created with a very shallow depth. The amorphous layer 38 and 42 so formed is critical to the present invention because it exhibits a lower melting point than crystalline or polycrystalline silicon. Note that the semiconductor substrate 10 underlying the temporary sidewall spacers 26 forms a shallow amorphous layer 42 while the semiconductor substrate 10 not underlying the temporary sidewall spacers 26 forms a deeper amorphous layer 38. The ion implantation 30 also forms a third amorphous layer 34 in the exposed polysilicon layer 22.

The ion implantation 30 is preferably performed at an energy of between about 1 KeV and 50 KeV and a dosage of between about $1 \times 10^{15}$ atoms/cm$^2$ and $1 \times 10^{16}$ atoms/cm$^2$. The deeper amorphous layer 38 has a depth of between about 300 Angstroms and 1,000 Angstroms. The shallow amorphous layer 42 has a depth of between about 50 Angstroms and 500 Angstroms.

Figure 6:
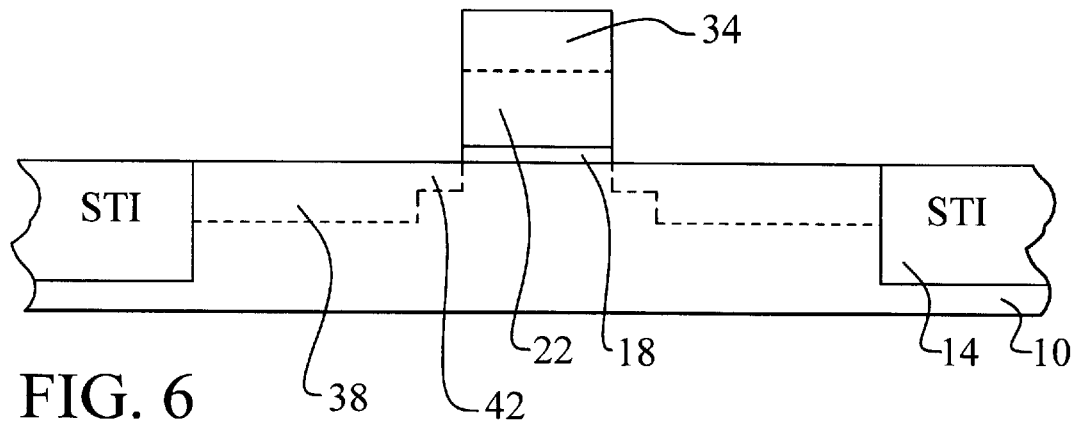

Referring now to FIG. 6, an important feature of the present invention is shown. The temporary sidewall spacers 26 are removed. The presence of the temporary sidewall spacers 26 has enabled the amorphous layer 38 and 42 to be formed with two depths to correspond to the later formed deep source and drain junctions and shallow source and drain extensions, respectively. The removal of the temporary sidewall spacers 26 facilitates the implantation of the lightly doped junctions that will form the shallow source and drain extensions.

Figure 7:
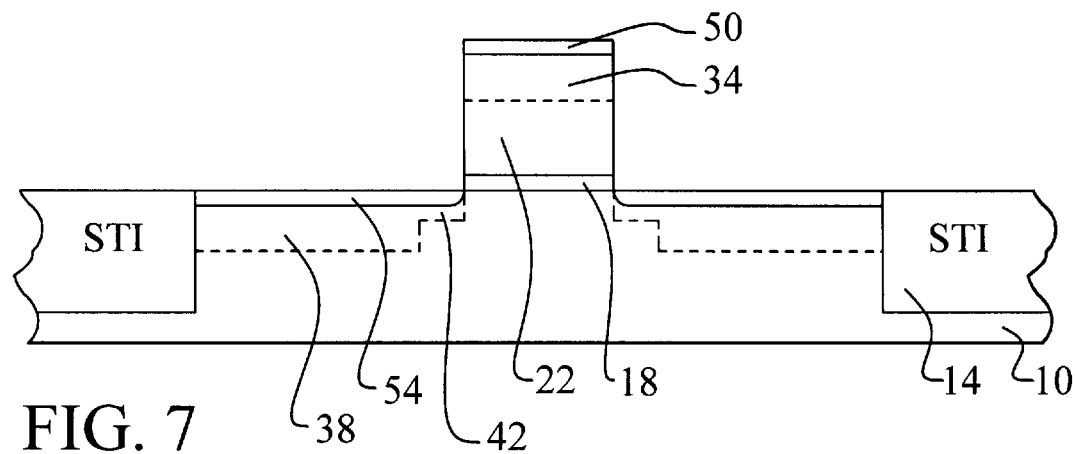

Referring now to FIG. 7, ions are implanted 46 into the exposed semiconductor substrate 10 to form lightly doped junctions 54 in the amorphous layer 38 and 42. The lightly doped junctions 54 so formed are self-aligned to the gate 22 of the transistor. Note that the lightly doped junctions 54 are very shallow. Preferably, $B^+$, $BF_2^+$, $As^+$, or $P^+$ ions are implanted at an ultra-low implant energy of between about 0.1 KeV and 10 KeV and a dose of between about $5 \times 10^{14}$ atoms/cm$^2$ and $1 \times 10^{16}$ atoms/cm$^2$. The lightly doped junctions 54 so formed have a depth of between about 50 Angstroms and 400 Angstroms. In addition, lightly doped junctions 50 are formed in the amorphous layer 34 of the gate.

Figure 8:
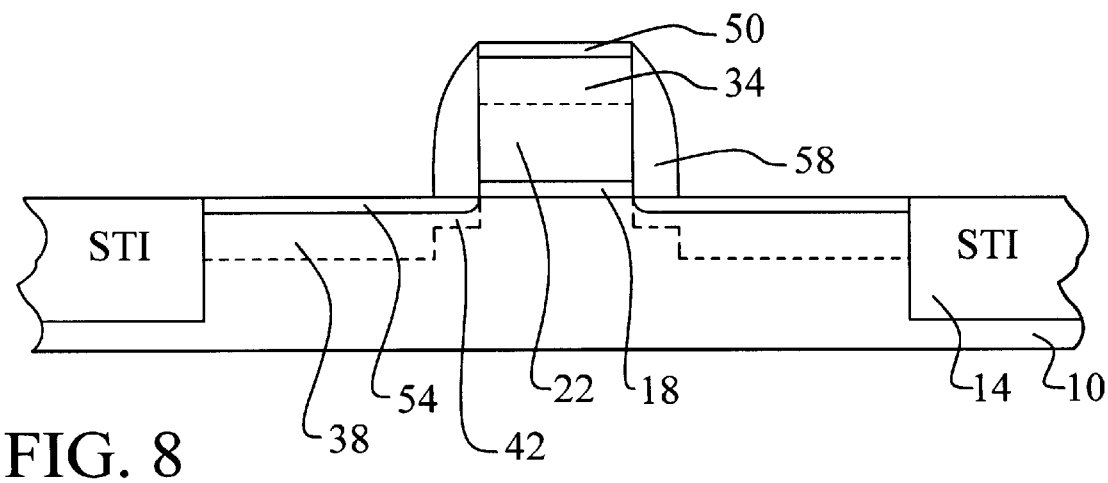

Referring now to FIG. 8, an important feature of the present invention is shown. Permanent sidewall spacers 58 are formed on the gates 22. The permanent sidewall spacers 58 may be formed in the same way as the temporary sidewall spacers 26 of FIGS. 2 and 3. For example, a dielectric layer is deposited overlying the semiconductor substrate 10. This dielectric layer is then anisotropically etched to form the permanent sidewall spacers 58.

The permanent sidewall spacers 58 are comprised of a material that has a relatively high melting point compared to silicon. In addition, the permanent sidewall spacers 58 should be substantially transparent to laser irradiation. Preferably, the permanent sidewall spacers 58 comprise $SiO_2$ or $Si_3N_4$.

Figure 9:
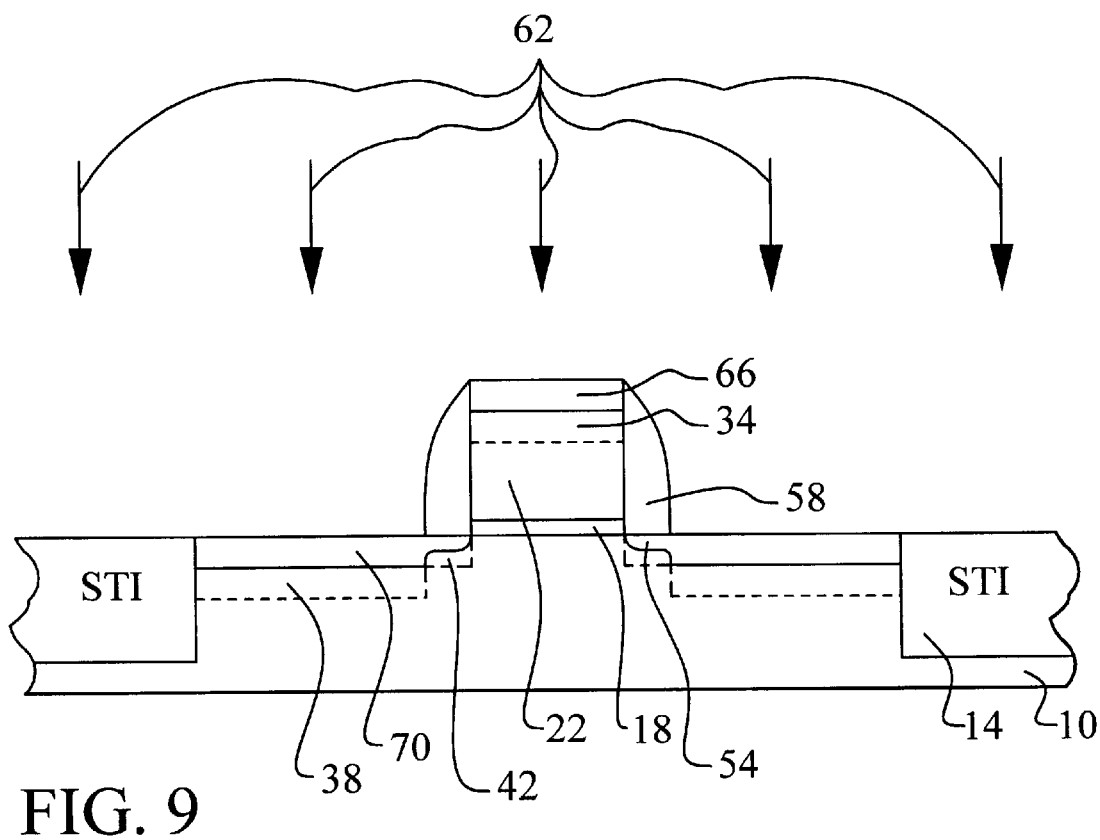

Referring now to FIG. 9, ions are implanted 62 into the exposed semiconductor substrate 10 to form heavily doped junctions 70 in the amorphous layer 38. The heavily doped junctions 70 will later form the deep source and drain junctions of the transistor. Note also that the implantation forms a heavily doped junction 66 in the amorphous layer 34 of the gate. Preferably, $B^+$, $BF_2^+$, $As^+$, or $P^+$ ions are implanted at an energy of between about 2 KeV and 50 KeV and a dose of between about $1 \times 10^{15}$ atoms/cm$^2$ and $1 \times 10^{17}$ atoms/cm$^2$. The heavily doped junctions 70 so formed have a depth of between about 250 Angstroms and 800 Angstroms.

Figure 10:
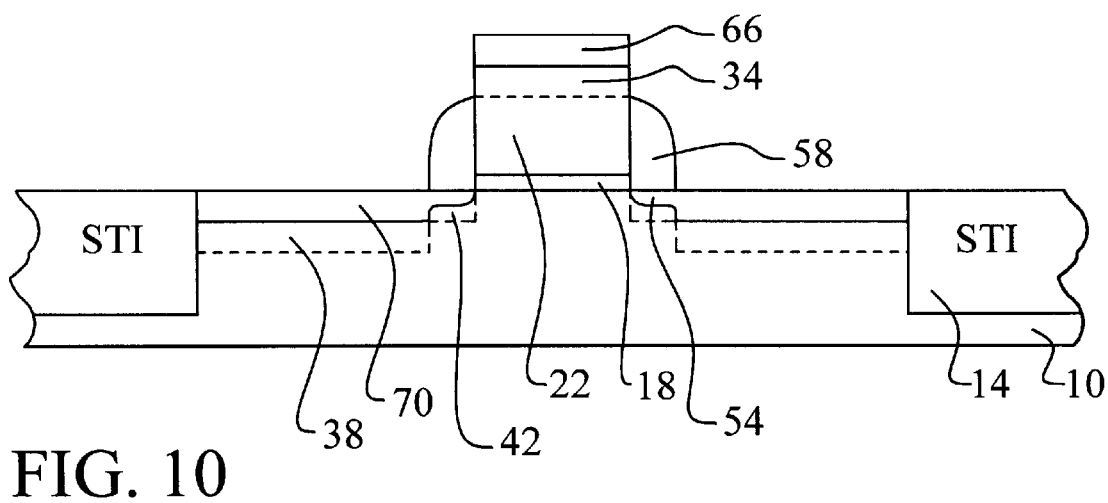

Referring now to FIG. 10, the permanent sidewall spacers 58 are over-etched to achieve a selected sidewall width. This step provides additional process margin for the later laser annealing process. The over-etching may be performed in the same etching process used to form the permanent sidewall spacers 58. The selected width of the permanent sidewall spacers 58 is between about 200 Angstroms and 3,000 Angstroms.

Figure 11:
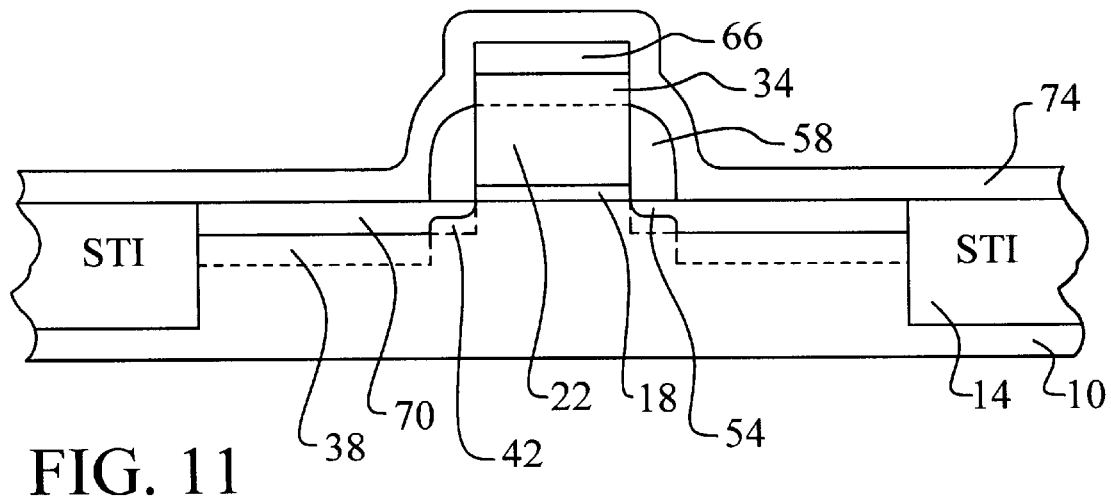

Referring now to FIG. 11, an important feature of the present invention is shown. A capping layer 74 is deposited overlying the semiconductor substrate 10, the gate 22, and the permanent sidewall spacers 58. The capping layer 74 is important to the present invention because it controls the temperature distribution profile across the silicon during the subsequent laser anneal. The capping layer 74 must comprise material that has a higher melting point than silicon so that it will not melt during the laser anneal. The capping layer 74 protects the silicon surface by acting as a barrier between the silicon and the ambient. In addition, the capping layer 74 must transmit the irradiated laser light to the underlying semiconductor substrate 10.

The capping layer 74 preferably comprises W, Ta, TiN, or TaN. Other common metal oxides and metal nitrides may also be used for the capping layer 74. The thickness of the capping layer 74 can be selected to control the temperature profile across the silicon. In this preferred embodiment, the capping layer 74 is deposited to a thickness of between about 50 Angstroms and 400 Angstroms.

Figure 12:
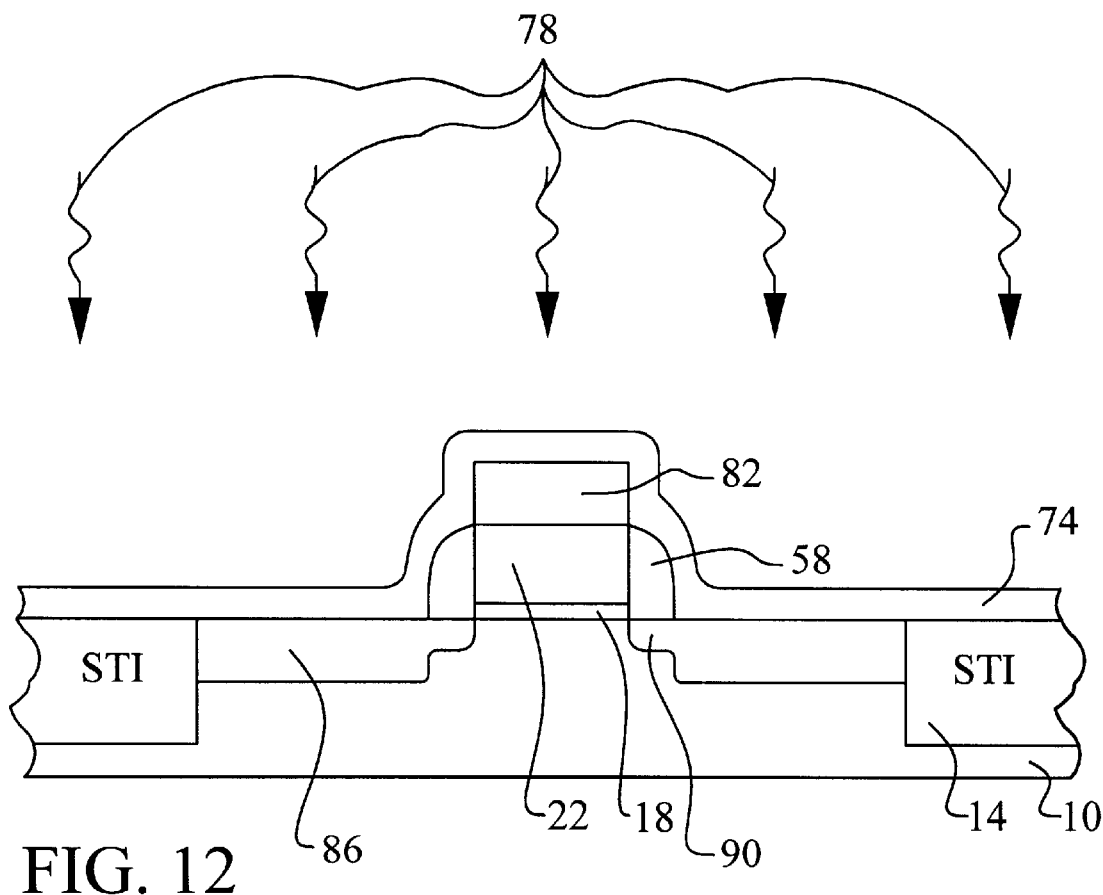

Referring now to FIG. 12, an important feature of the present invention is illustrated. The semiconductor substrate 10 is irradiated with laser light 78. This irradiation causes the silicon in the amorphous layer 38 and 42 to melt. The implanted ions in the lightly doped junction 54 and the heavily doped junction 70 diffuse into the amorphous layer 38 and 42 to simultaneously form the deep source and drain junctions 86 and the shallow source and drain extensions 90 for the transistor. The laser irradiation also causes the silicon in the amorphous layer 34 of the gate to melt. The implanted ions in the heavily doped region 66 diffuse into the amorphous layer 34 to form a heavily doped junction 82 in the polysilicon layer 22 of the gate. Only one laser anneal is required to form both the deep source and drain junctions 86, the shallow source and drain extensions 90, and the heavily doped gate junction 82.

The laser light fluence is carefully controlled so that the temperature of the silicon only rises sufficiently to melt the amorphous layer 38 and 42 in the silicon. The crystalline silicon in the semiconductor substrate 10 below the amorphous layer 38 and 42 does not melt. The dopant diffusion is therefore limited to the previously defined amorphous layer 38 and 42. It is therefore possible to create very shallow, yet very abrupt junctions. In addition, the high re-growth velocity of the amorphous silicon layer 38 and 42 enables it to re-crystallize from the underlying semiconductor substrate 10. Finally, the amorphous layer 34 of the gate re-crystallizes from the underlying polysilicon layer 22 and becomes a polycrystalline layer upon re-crystallization.

The laser light 78 wavelength is preferably between about 157 nanometers and 308 nanometers. The laser light 78 fluence is controlled between about 0.1 Joules/cm$^2$ and 1.5 Joules/cm$^2$. The deep source and drain junctions 86 so formed have a depth of between about 300 Angstroms and 1,000 Angstroms and a concentration of between about $1 \times 10^{16}$ atoms/cm$^3$ and $1 \times 10^{21}$ atoms/cm$^3$. The shallow source and drain extensions 90 so formed have a depth of between about 50 Angstroms and 500 Angstroms and a concentration of between about $1 \times 10^{16}$ atoms/cm$^3$ and $1 \times 10^{21}$ atoms/cm$^3$.

An important feature of the present invention is that the source and drain extensions have not been annealed until this step. In addition, the permanent spacers have been over-etched. The combination of these factors allows the laser energy 78 to reach the deep source and drain junctions 86 and the shallow extensions 90 simultaneously. Since the silicon has been pre-amorphized to two different depths, the final junction depths are defined while both the deep junctions and the shallow extensions are annealed or activated in a single step. This differs from the prior art approach found, for example, in Talwar et al (U.S. Pat. No. 5,956,603).

Figure 13:
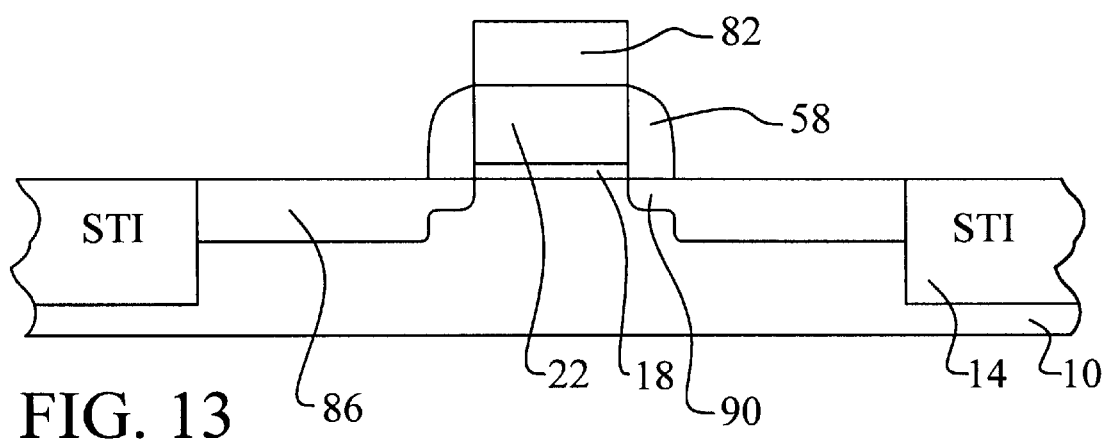

Referring now to FIG. 13, the capping layer 74 is removed to complete the manufacture of the integrated circuit device.

Figure 14:
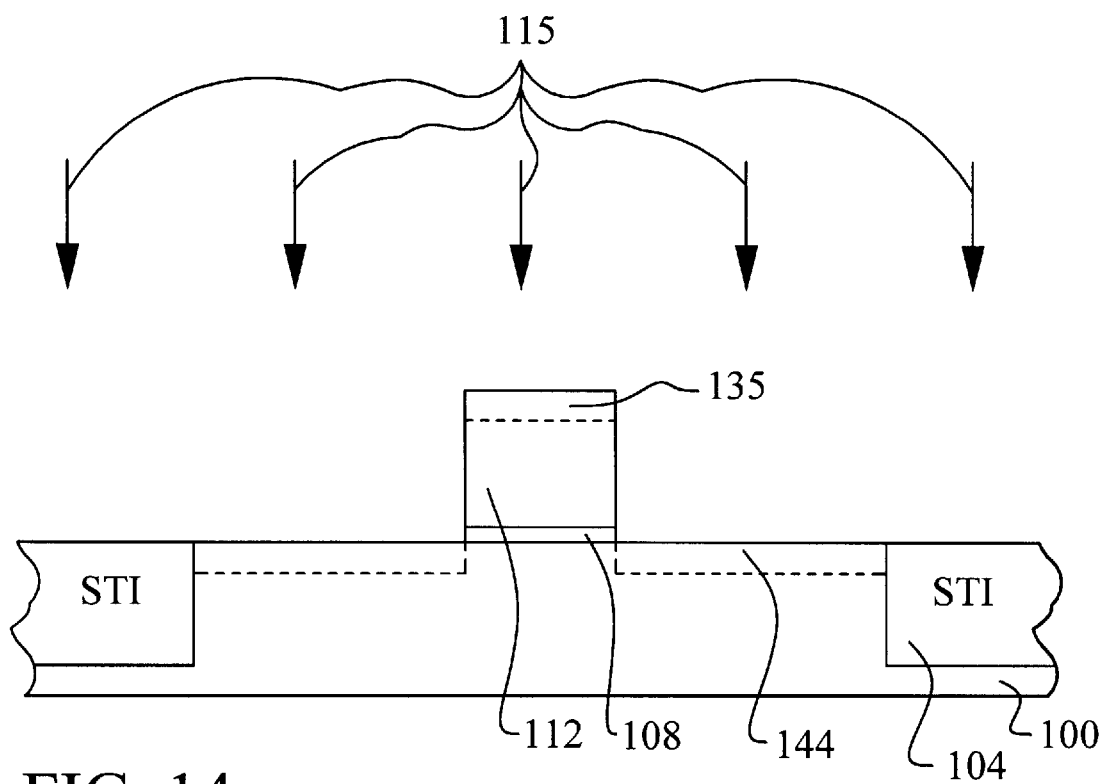
FIGS. 14 through 23 schematically illustrate in cross-sectional representation a second preferred embodiment of the present invention.

Referring now to FIG. 14, the second preferred embodiment of the present invention will be illustrated. Once again, a single laser anneal is used to form both deep source and drain junctions and shallow source and drain extensions. As in FIG. 1 of the first embodiment, a gate 112 is formed overlying the semiconductor substrate 100. The gate 112 again comprises a polysilicon layer 112 overlying a gate oxide layer 108.

Referring now particularly to FIG. 14, ions are implanted 115 into the exposed semiconductor substrate 100 to form shallow amorphous layers 144 and into the polysilicon layer 112 to form amorphous layer 135. Preferably, Si, Ge, or Ar ions are implanted to break lattice bonds and to thereby create non-crystalline or amorphous silicon layers in the semiconductor substrate 100 and in the polysilicon gate 112. The ion implantation 115 is preferably performed at an energy of between about 1 KeV and 10 KeV and a dosage of between about $1 \times 10^{15}$ atoms/cm$^2$ and $1 \times 10^{16}$ atoms/cm$^2$. The shallow amorphous layer 144 has a depth of between about 50 Angstroms and 500 Angstroms.

Figure 15:
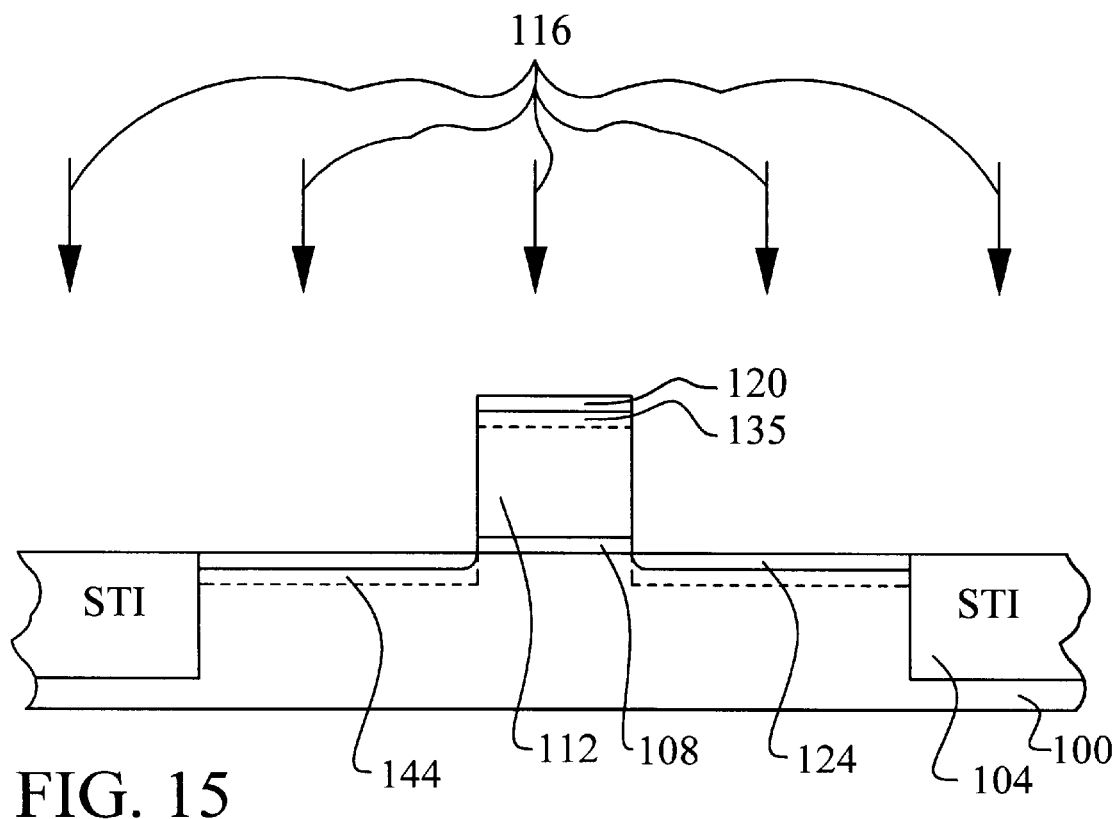

Referring now to FIG. 15, ions are implanted 116 into the exposed semiconductor substrate 100 to form lightly doped junctions 124 in the shallow amorphous layers 144. The lightly doped junctions 124 so formed are self-aligned to the gate 112 of the transistor. Note that the lightly doped junctions 124 are very shallow. Preferably, B$^+$, BF$_2^+$, As$^+$, or P$^+$ ions are implanted at an ultra-low implant energy of between about 0.2 KeV and 10 KeV and a dose of between about $5 \times 10^{14}$ atoms/cm$^2$ and $1 \times 10^{16}$ atoms/cm$^2$. The lightly doped junctions 54 so formed have a depth of between about 50 Angstroms and 400 Angstroms. In addition, lightly doped junctions 120 are formed in the amorphous layer 135 of the gate 112.

Figure 16:
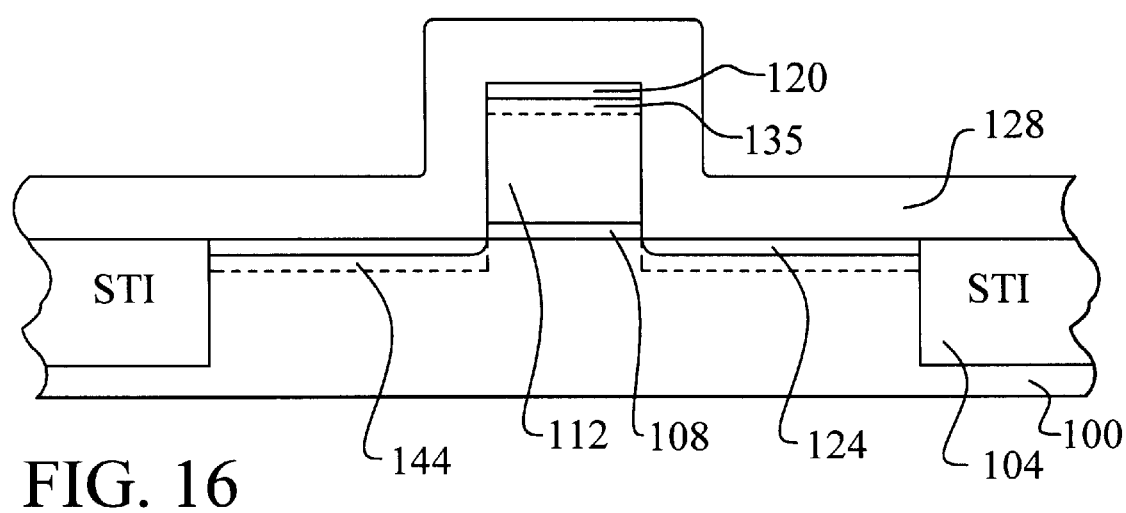

Referring now to FIG. 16, a dielectric layer 128 is deposited overlying the semiconductor substrate 100 and the gate 112. The dielectric layer 128 will be later etched to form sidewall spacers to the gate 112. The dielectric layer 128 is comprised of a material that has a relatively high melting point compared to silicon. In addition, the dielectric layer 128 should be substantially transparent to laser irradiation. Preferably, the dielectric layer comprises SiO$_2$ or Si$_3$N$_4$. The dielectric layer 128 is deposited to a thickness of between about 200 Angstroms and 1,500 Angstroms.

Figure 17:
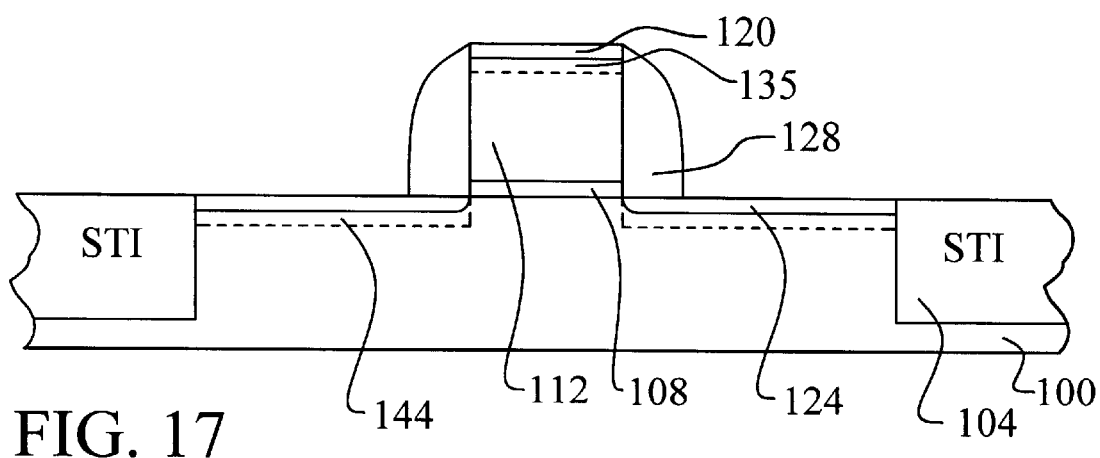

Referring now to FIG. 17, the dielectric layer 128 is anisotropically etched to form sidewall spacers 128 on the gate 112.

Figure 18:
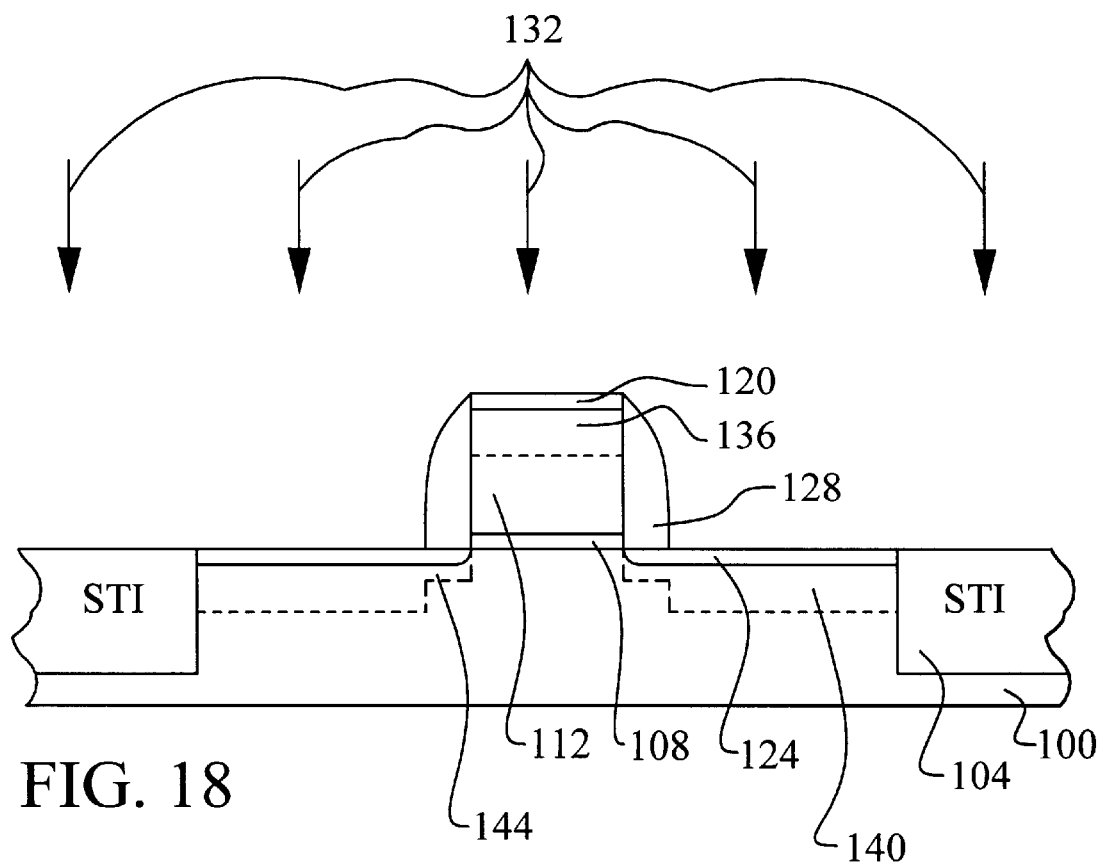

Referring now to FIG. 18, an important step in the method of the present invention is illustrated. Ions are implanted 132 into the exposed semiconductor substrate 100 to form a deeper amorphous layer 140 in the semiconductor substrate 100. Preferably, Si, Ge, or Ar ions are implanted to break lattice bonds and create a non-crystalline or amorphous silicon layer 140 in the semiconductor substrate 100. By carefully selecting the weight of the ion and the implantation energy, the amorphous layer 140 can be created with a very shallow depth. The ion implantation 132 also forms a third amorphous layer 136 in the exposed polysilicon layer 112.

The ion implantation 132 is preferably performed at an energy of between about 5 KeV and 50 KeV and a dosage of between about $1 \times 10^{15}$ atoms/cm$^2$ and $1 \times 10^{16}$ atoms/cm$^2$. The deeper amorphous layer 140 has a depth of between about 300 Angstroms and 1,000 Angstroms.

Figure 19:
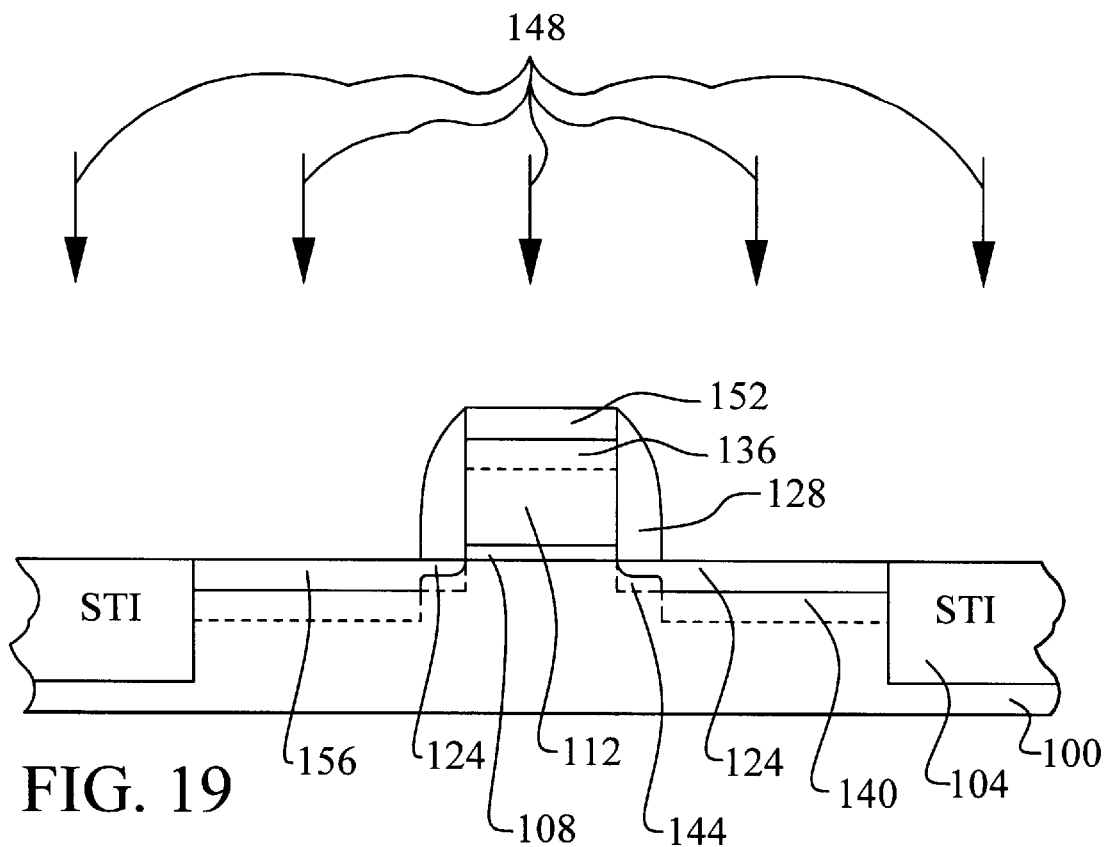

Referring now to FIG. 19, ions are implanted 148 into the exposed semiconductor substrate 100 to form heavily doped junctions 156 in the amorphous layer 140. The heavily doped junctions 156 will later form the deep source and drain junctions of the transistor. Note also that the implantation forms a heavily doped junction 152 in the amorphous layer 136 of the gate 112. Preferably, B$^+$, BF$_2^+$, As$^+$, or P$^+$ ions are implanted at an energy of between about 2 KeV and 50 KeV and a dose of between about $1 \times 10^{15}$ atoms/cm$^2$ and $1 \times 10^{17}$ atoms/cm$^2$. The heavily doped junctions 156 so formed have a depth of between about 250 Angstroms and 800 Angstroms.

Figure 20:
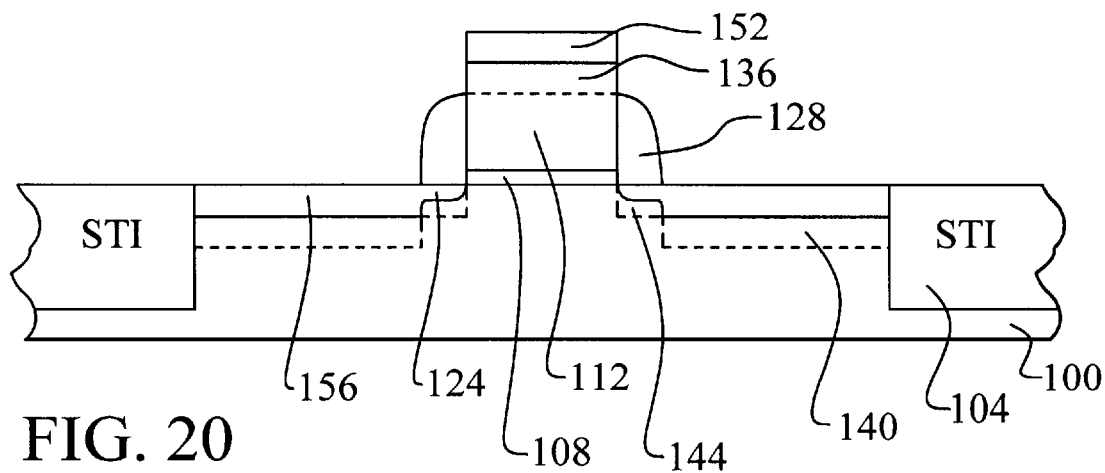

Referring now to FIG. 20, an important feature of the present invention is illustrated. The sidewall spacers 128 are over-etched to achieve a selected sidewall width. This step is important to the present invention because it provides additional process margin for the later laser annealing process. The over-etching may be performed using the same etching process used to originally form the sidewall spacers 128 in FIG. 17. The selected width of the over-etched sidewall spacers 128 is between about 200 Angstroms and 3,000 Angstroms.

Figure 21:
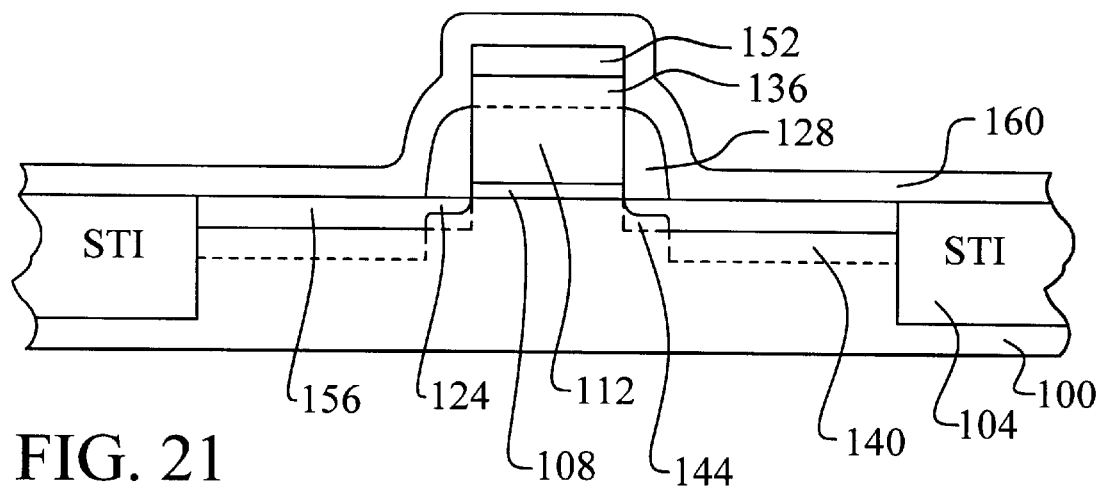

Referring now to FIG. 21, an important feature of the present invention is shown. A capping layer 160 is deposited overlying the semiconductor substrate 100, the gate 112, and the sidewall spacers 128. The capping layer 160 is important to the present invention because it controls the temperature distribution profile across the silicon during the subsequent laser anneal. The capping layer 160 must comprise material that has a higher melting point than silicon so that it will not melt during the laser anneal. The capping layer 160 protects the silicon surface by acting as a barrier between the silicon and the ambient. In addition, the capping layer 160 must transmit the irradiated laser light to the underlying semiconductor substrate 100.

The capping layer 160 preferably comprises W, Ta, TiN, or TaN. The capping layer 160 may also comprise other metal oxides or metal nitrides common to integrated circuit art. The thickness of the capping layer 160 can be selected to control the temperature profile across the silicon. In this preferred embodiment, the capping layer 160 is deposited to a thickness of between about 50 Angstroms and 400 Angstroms.

Figure 22:
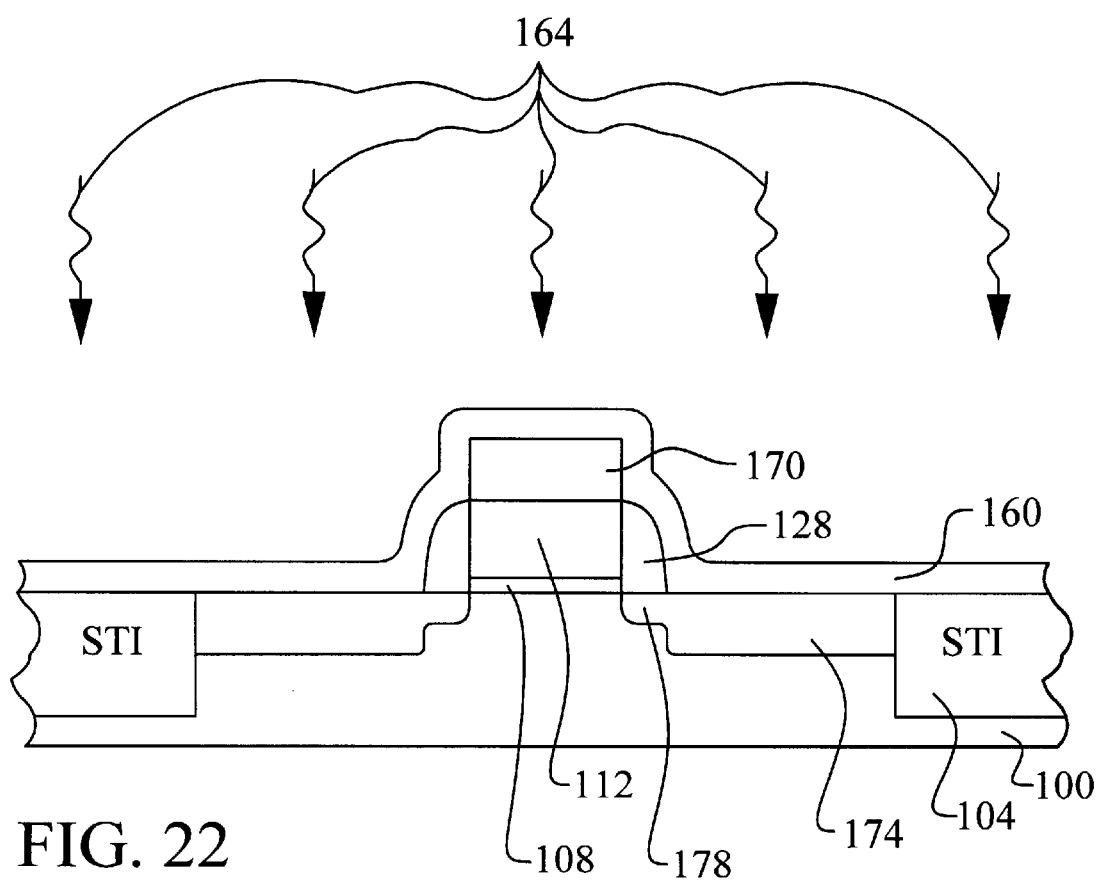

Referring now to FIG. 22, an important feature of the present invention is illustrated. The semiconductor substrate 100 is irradiated with laser light 164. This irradiation causes the silicon in the amorphous layers 140 and 144 to melt. The implanted ions in the lightly doped junction 124 diffuse in the shallow amorphous layer 144. The implanted ions in the heavily doped junction 156 diffuse in the deeper amorphous layer 140. The deep source and drain junctions 174 and the shallow source and drain extensions 178 for the transistor are simultaneously formed. Only one laser anneal is required to form both the deep source and drain junctions 174 and the shallow source and drain extensions 178. Finally, note that the laser irradiation causes the silicon in the amorphous layer 136 of the gate 112 to melt. The implanted ions in the heavily doped junction 152 diffuse into the amorphous layer 136 to for a heavily doped junction 170 in the polysilicon layer 112 of the gate.

The laser light fluence is carefully controlled so that the temperature of the silicon only rises sufficiently to melt the amorphous layer 140 and 144 in the silicon. The crystalline silicon in the semiconductor substrate 100 below the amorphous layer 140 and 144 does not melt. The dopant diffusion is therefore limited to the previously defined amorphous layer 140 and 144. It is therefore possible to create very shallow, yet very abrupt junctions. In addition, the high re-growth velocity of the amorphous silicon layer 140 and 144 enables it to re-crystallize from the underlying semiconductor substrate 100. By comparison, the amorphous layer 136 of the gate re-crystallizes from the underlying polysilicon layer 112 and becomes a polycrystalline layer upon re-crystallization.

The laser light 164 wavelength is preferably between about 157 nanometers and 308 nanometers. The laser light 164 fluence is controlled between about 0.1 Joules/cm$^2$ and 1.5 Joules/cm$^2$. The deep source and drain junctions 174 so formed have a depth of between about 300 Angstroms and 1,000 Angstroms and a concentration of between about $1 \times 10^{16}$ atoms /cm$^3$ and $1 \times 10^{21}$ atoms/cm$^3$. The shallow source and drain extensions 178 so formed have a depth of between about 50 Angstroms and 500 Angstroms and a concentration of between about $1 \times 10^{16}$ atoms/cm$^3$ and $1 \times 10^{21}$ atoms /cm$^3$.

Figure 23:
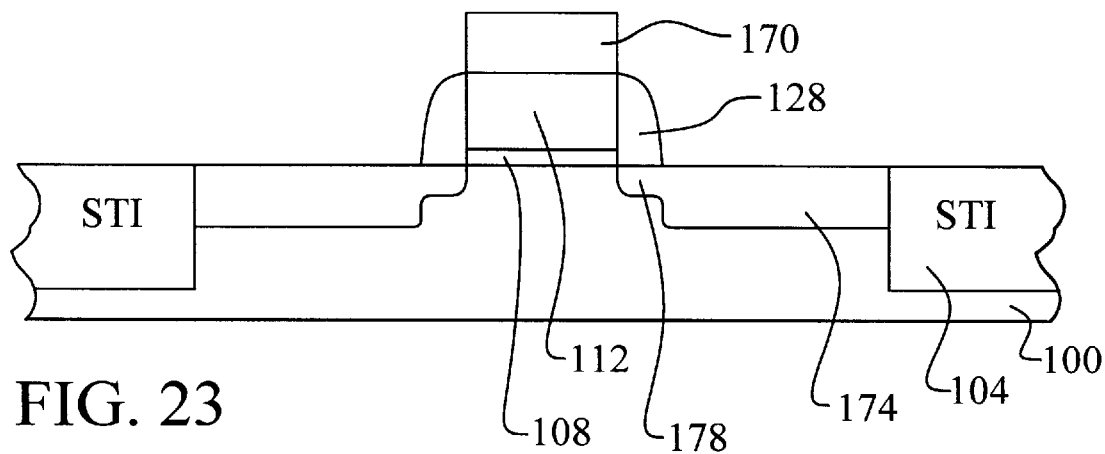

Referring now to FIG. 23, the capping layer 160 is removed to complete the manufacture of the integrated circuit device.

Figure 24:
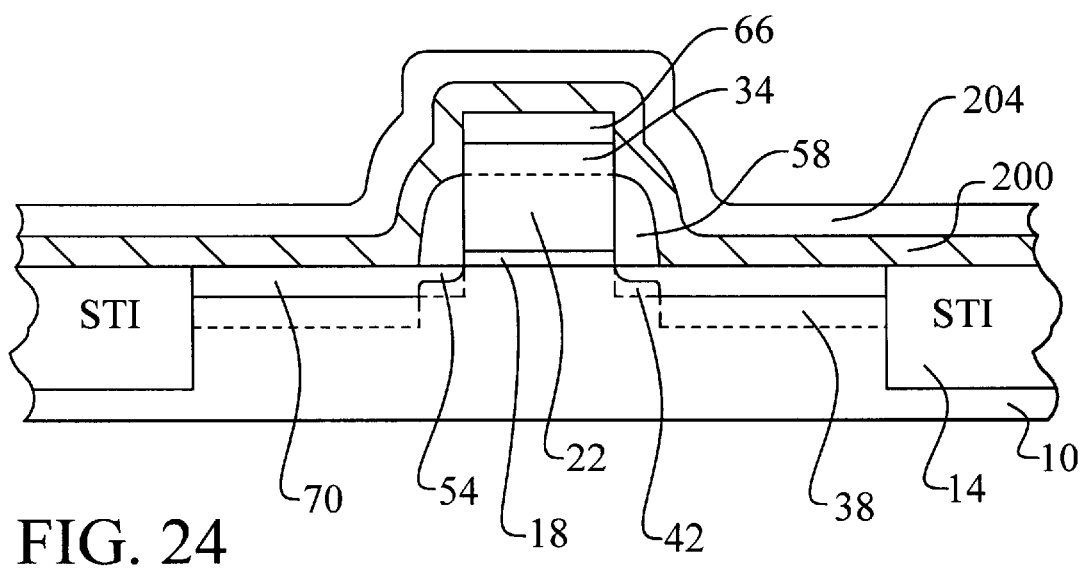
FIGS. 24 through 26 schematically illustrate in cross-sectional representation a third preferred embodiment of the present invention.

Referring now to FIG. 24, a third embodiment of the present invention is illustrated. Beginning with either FIG. 10 of the first embodiment or FIG. 20 of the second embodiment, a method is now illustrated for the simultaneous formation of the deep source and drain junctions, the shallow source and drain extensions and a self-aligned silicide using the laser anneal.

More particularly, FIG. 24 begins with integrated circuit device of FIG. 10 after the heavily doped junctions 70 have been formed and the permanent sidewall spacer 58 overetch. A metal layer 200 is deposited overlying the semiconductor substrate 10 and the gate 22. The metal layer 200 will later be reacted to form metal silicide on silicon surfaces that are in contact with the metal layer 200. The metal layer preferably comprises Ti, Co, Ni, or a Ni-Pt alloy. The metal layer 200 may be deposited using physical vapor deposition (PVD) or CVD, for example, to a thickness of between about 50 Angstroms and 450 Angstroms.

A capping layer 204 is deposited overlying the metal layer 200. The capping layer 204 is important to the present invention because it controls the temperature distribution profile across the metal layer 200 and the silicon during the subsequent laser anneal. The capping layer 204 must comprise a material that has a higher melting point than the metal layer 200 and the silicon so that it will not melt during the laser anneal. The capping layer 204 protects the metal layer 200 by acting as a barrier between the metal layer 200 and the ambient. In addition, the capping layer 204 must transmit the irradiated laser light to the underlying metal layer 200 and to the semiconductor substrate 10.

The capping layer 204 preferably comprises W, Ta, TiN, or TaN. Alternatively, the capping layer 204 may comprise a metal oxide or metal nitride common to the art. The thickness of the capping layer 204 can be selected to control the temperature profile across the metal layer 200, the semiconductor substrate 10 and the polysilicon layer 22 of the gate. In this preferred embodiment, the capping layer 204 is deposited to a thickness of between about 50 Angstroms and 400 Angstroms.

Figure 25:
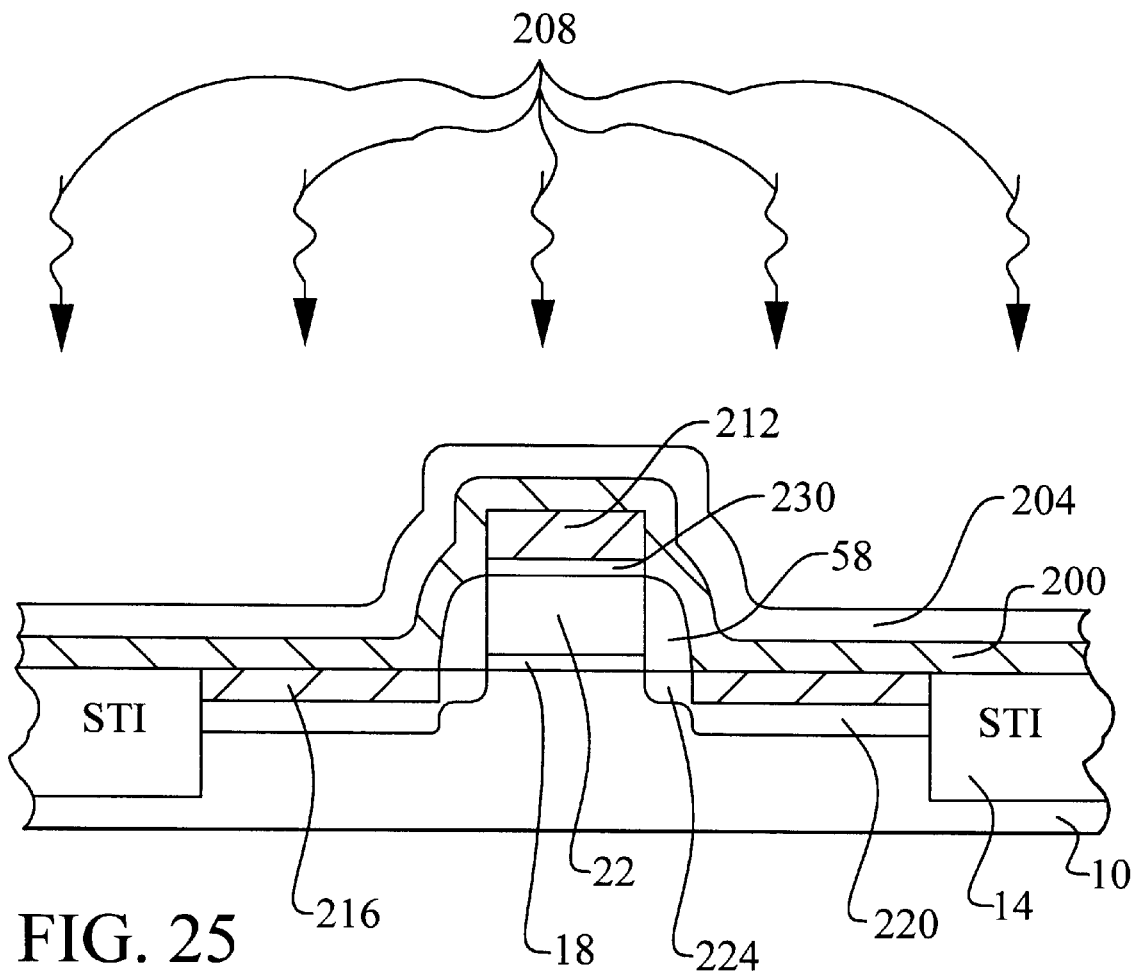

Referring now to FIG. 25, an important feature of the present invention is illustrated. The semiconductor substrate 10, the metal layer 200 and the polysilicon layer 22 are irradiated with laser light 208. This irradiation causes the silicon in the amorphous layer 38 and 42 of the semiconductor substrate 10 and the amorphous layer 34 of the polysilicon layer 22 to melt. The implanted ions in the lightly doped junction 54 and the heavily doped junction 70 diffuse into the amorphous layer 38 and 42 to simultaneously form the deep source and drain junctions 220 and the shallow source and drain extensions 224 for the transistor.

The metal layer 200 also is heated during the laser irradiation step. The laser fluence is chosen such that it is just sufficient to melt the amorphous layer beneath the metal. The silicon atoms then diffuse and mix with the metal atoms to form silicides. The metal layer 200 thus reacts with the silicon in contact with the metal layer 200 to form silicide. Note that metal layer 200 may or may not be melted, depending on the laser fluence. In the present invention, there is a high tendency for the metal to melt during the laser irradiation. A silicide layer 216 is therefore formed in the deep source and drain regions 220, and a silicide layer 212 is formed in the polysilicon layer 22 of the gate. Because no silicide forms on the sidewall spacers 58, the silicide layer 212 and 216 is formed self-aligned to the transistor gate, drain, and source.

The laser light 208 fluence is carefully controlled so that the temperature of the silicon only rises sufficiently to melt the amorphous layer 38 and 42 in the silicon. The crystalline silicon in the semiconductor substrate 10 below the amorphous layer 38 and 42 does not melt. The dopant diffusion is therefore limited to the previously defined amorphous layer 38 and 42. Note also that the laser irradiation causes the silicon in the amorphous layer 34 to melt. The implanted ions in the heavily doped junction 66 diffuse into the amorphous layer 34 to from a heavily doped junction 230 in the polysilicon layer 22 of the gate. It is therefore possible to create very shallow, yet very abrupt junctions. In addition, the high re-growth velocity of the amorphous silicon layer 38 and 42 enables it to re-crystallize from the underlying semiconductor substrate 10 so that the shallow junction will not be completely consumed by the silicide formation. By comparison, the amorphous layer 34 of the gate re-crystallizes from the underlying polysilicon layer 22 and becomes a polycrystalline layer upon re-crystallization.

The laser light 208 wavelength is preferably between about 157 nanometers and 308 nanometers. The laser light 208 fluence is controlled between about 0.1 Joules/cm$^2$ and 1.5 Joules/cm$^2$. The deep source and drain junctions 220 so formed have a depth of between about 300 Angstroms and 1,000 Angstroms and a concentration of between about $1 \times 10^{16}$ atoms/cm$^3$ and $1 \times 10^{21}$ atoms/cm$^3$. The shallow source and drain extensions 224 so formed have a depth of between about 50 Angstroms and 300 Angstroms and a concentration of between about $1 \times 10^{16}$ atoms/cm$^3$ and $1 \times 10^{21}$ atoms/cm$^3$.

Note that only one laser anneal is required to form the deep source and drain junctions 220, the shallow source and drain extensions 224, and the silicide layer 212 and 216. Note also that, while the silicon atoms and the metal atoms are reacting at the metal-silicon interface to form silicide, the amorphous silicon layers are re-crystallizing from the underlying substrate. The high re-growth velocity of the re-crystallization prevents the metal atoms from diffusing through the entire melt depth. In this way, the junctions will not be completely consumed by the silicide formation.

Next, the silicon body or wafer is preferably subjected to a heat treatment to convert the silicide layer into a highly crystalline silicide with a desired resistivity value. This heat treatment may or may not be necessary, depending on the metal-silicon system that is employed for silicidation. Herein, it is preferred that a heat treatment be performed. The heat treatment can either be a RTA with appropriate annealing temperature and time or multiple laser pulses with a low laser fluence. For RTA, the temperature range is between about 250 degrees C and 900 degrees C. The duration range is between about 5 seconds and 1 hour. For heat treatment using multiple laser pulses, the laser fluence should be between about 0.05 J/cm$^2$ and 0.5 J/cm$^2$ with between about 1 pulses and 100 pulses.

Figure 26:
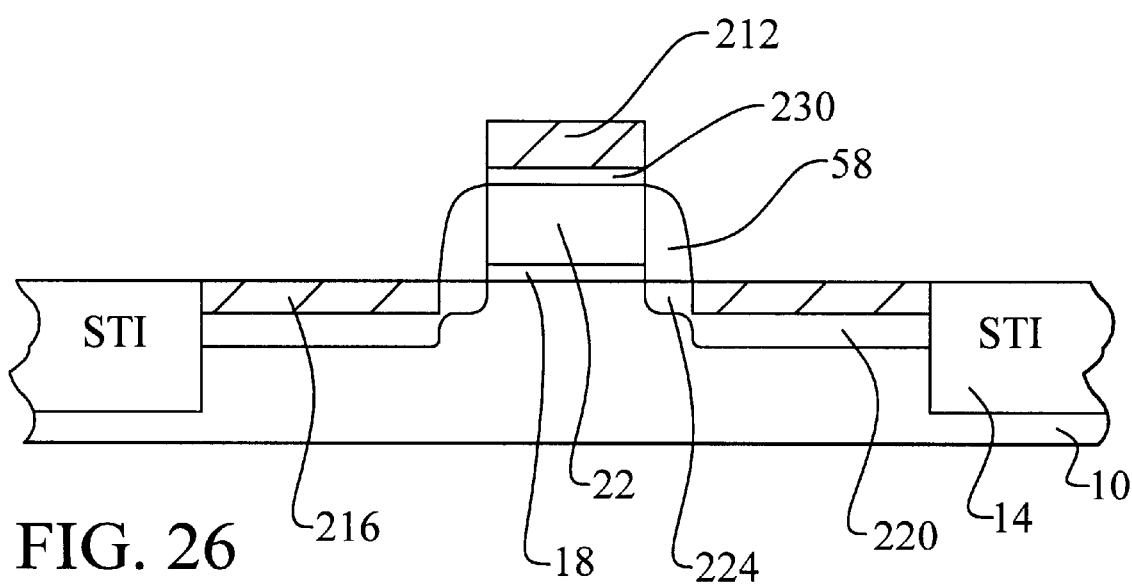

Referring now to FIG. 26, the capping layer 204 and the unreacted metal layer 200 are removed to complete the manufacture of the integrated circuit device.

As shown in the preferred embodiments, the present invention provides a very manufacturable process for forming MOS transistor device with abrupt, shallow junctions in an integrated circuit device. The use of a laser anneal to selectively melt only the amorphized silicon enables careful control of implanted dopant diffusion. Deep source and drain junctions and shallow source and drain extensions for sub-0.1 micron devices can be activated and diffused using a single laser anneal. In addition, the method of the present invention can be used to form self-aligned silicide during the same laser anneal that activates and diffuses the deep source and drain junctions and shallow source and drain extensions.

While the invention has been particularly shown and described with reference to the preferred embodiments thereof, it will be understood by those skilled in the art that various changes in form and details may be made without departing from the spirit and scope of the invention.

What is claimed is:

1. A method to form MOS transistors in the manufacture of an integrated circuit device comprising:
    providing gates overlying a semiconductor substrate wherein each said gate comprises a gate oxide layer overlying said semiconductor substrate and a polysilicon layer overlying said gate oxide layer;
    forming temporary sidewall spacers on said gates;
    over-etching said temporary sidewall spacers to a selected width;
    thereafter implanting ions into exposed said semiconductor substrate to form an amorphous layer wherein said amorphous layer underlying said temporary sidewall spacers is shallower than said amorphous layer not underlying said temporary sidewall spacers;
    thereafter removing said temporary sidewall spacers;
    thereafter implanting ions into exposed said semiconductor substrate to form lightly doped junctions in said shallower and said deeper amorphous layer;
    thereafter forming permanent sidewall spacers on said gates;
    thereafter implanting ions into exposed said semiconductor substrate to form heavily doped junctions in said deeper amorphous layer;
    thereafter depositing a capping layer overlying said semiconductor substrate and said gates wherein said capping layer protects said semiconductor substrate during irradiation;
    thereafter irradiating said semiconductor substrate with laser light to melt said amorphous layer while crystalline regions of said semiconductor substrate remain in solid state, to diffuse ions in said heavily doped junctions into said deeper amorphous layer and in said lightly doped junctions into said shallower amorphous layer, and to thereby simultaneously form deep source and drain junctions and shallow source and drain extensions for said transistors; and
    thereafter removing said capping layer to complete the manufacture of said integrated circuit device.

2. The method according to claim 1 further comprising over-etching said permanent sidewall spacers to a reduced thickness after said step of implanting ions into exposed said semiconductor substrate to form said heavily doped junctions and before said step of depositing said capping layer.

3. The method according to claim 1 further comprising:
    implanting ions into said polysilicon layer to form an amorphous layer during said step of implanting ions into exposed said semiconductor substrate to form said amorphous layer;
    depositing a metal layer overlying said semiconductor substrate and said polysilicon layer after said step of implanting ions into exposed said semiconductor substrate to form said heavily doped junctions and before said step of depositing said capping layer;
    irradiating polysilicon layer during said step of irradiating said semiconductor substrate to thereby form a silicide layer overlying said gates and said deep source and drain junctions of said transistors; and
    thereafter removing said capping layer and said metal layer.

4. The method according to claim 1 wherein said capping layer comprises one of the group of: W, Ta, TiN, TaN, metal oxide, and metal nitride.

5. The method according to claim 1 wherein said permanent sidewall spacer comprises one of the group of: $SiO_2$ and $Si_3N_4$.

6. The method according to claim 1 wherein said step of irradiating is performed using a laser light with a fluence of between about 0.1 Joules/cm$^2$ and 1.5 Joules/cm$^2$ and a wavelength of between about 157 nanometers and 308 nanometers.

7. The method according to claim 1 wherein said step of implanting ions into exposed said semiconductor substrate to form an amorphous layer comprises implanting one of the group of: Si and Ge, wherein said implantation is performed at an energy of between about 1 KeV and 50 KeV and a dosage of between about 1×10$^{15}$ atoms/cm$^2$ and 1×10$^{16}$ atoms/cm$^2$.

8. A method to form MOS transistors in the manufacture of an integrated circuit device comprising:

providing gates overlying a semiconductor substrate wherein each said gate comprises a gate oxide layer overlying said semiconductor substrate and a polysilicon layer overlying said gate oxide layer;

implanting ions into exposed said semiconductor substrate to form a shallower amorphous layer in said semiconductor substrate;

thereafter implanting ions into exposed said semiconductor substrate to form lightly doped junctions in said shallower amorphous layer;

thereafter forming sidewall spacers on said gates;

thereafter implanting ions into exposed said semiconductor substrate to form a deeper amorphous layer;

thereafter implanting ions into exposed said semiconductor substrate to form heavily doped junctions in said deeper amorphous layer;

thereafter depositing a capping layer overlying said semiconductor substrate and said gates wherein said capping layer protects said semiconductor substrate during irradiation;

thereafter irradiating said semiconductor substrate with laser light to melt said shallower and said deeper amorphous layers while crystalline regions of said semiconductor substrate remain in solid state, to diffuse ions in said heavily doped junctions in said deeper amorphous layer, to diffuse ions in said lightly doped junctions into said shallower amorphous layer, and to thereby simultaneously form deep source and drain junctions and shallow source and drain extensions for said transistors; and thereafter removing said capping layer to complete the manufacture of said integrated circuit device.

9. The method according to claim 8 further comprising over-etching said sidewall spacers to a reduced thickness after said step of implanting ions into exposed said semiconductor substrate to form said heavily doped junctions and before said step of depositing said capping layer.

10. The method according to claim 8 further comprising:

implanting ions into said polysilicon layer to form an amorphous layer during said step of implanting ions into exposed said semiconductor substrate to form said amorphous layer;

depositing a metal layer overlying said semiconductor substrate and said polysilicon layer after said step of implanting ions into exposed said semiconductor substrate to form said heavily doped junctions and before said step of depositing said capping layer;

irradiating said polysilicon layer during said step of irradiating said semiconductor substrate to thereby form a silicide layer overlying said gates and said deep source and drain junctions of said transistors; and thereafter removing said capping layer and said metal layer.

11. The method according to claim 8 wherein said capping layer comprises one of the group of: W, Ta, TiN, TaN, metal oxide and metal nitride.

12. The method according to claim 8 wherein said sidewall spacers comprise one of the group of: SiO$_2$ and Si$_3$N$_4$.

13. The method according to claim 8 wherein said step of irradiating is performed using a laser light with a fluence of between about 0.1 Joules/cm$^2$ and 1.5 Joules/cm$^2$ and a wavelength of between about 157 nanometers and 308 nanometers.

14. The method according to claim 8 wherein said step of implanting ions into exposed said semiconductor substrate to form an amorphous layer comprises implanting one of the group of: Si and Ge, wherein said implantation is performed at an energy of between about 1 KeV and 50 KeV and a dosage of between about 1×10$^{15}$ atoms/cm$^2$ and 1×10$^{16}$ atoms/cm$^2$.

15. A method to form MOS transistors in the manufacture of an integrated circuit device comprising:

providing gates overlying a semiconductor substrate wherein each said gate comprises a gate oxide layer overlying said semiconductor substrate and a polysilicon layer overlying said gate oxide layer;

forming temporary sidewall spacers on said gates;

over-etching said temporary sidewall spacers to a selected width;

thereafter implanting ions into exposed said semiconductor substrate and into exposed said polysilicon layer to form an amorphous layer in said semiconductor substrate and said polysilicon layer wherein said amorphous layer underlying said temporary sidewall spacers is shallower than said amorphous layer not underlying said temporary sidewall spacers;

thereafter removing said temporary sidewall spacers;

thereafter implanting ions into exposed said semiconductor substrate to form lightly doped junctions in said shallower amorphous layer;

thereafter forming permanent sidewall spacers on said gates;

thereafter implanting ions into exposed said semiconductor substrate to form heavily doped junctions in said deeper amorphous layer;

thereafter depositing a metal layer overlying said semiconductor substrate and said gates;

thereafter depositing a capping layer overlying said metal layer wherein said capping layer protects said metal layer during irradiation;

thereafter irradiating said semiconductor substrate, said metal layer, and said polysilicon layer with laser light to melt said amorphous layer while said polysilicon layer and crystalline regions of said semiconductor substrate remain in solid state, to thereby diffuse ions in said heavily doped junctions into said deep amorphous layer and in said lightly doped junctions into said shallower amorphous layer, to react said metal layer with said semiconductor substrate and with said polysilicon layer, and to thereby simultaneously form deep source and drain junctions, shallow source and drain extensions, and a silicide layer overlying said gates and said deep source and drain junctions for said transistors;

heating said silicide layer and said semiconductor substrate to improve the crystal structure of said silicide layer; and thereafter removing said capping layer and said metal layer to complete the manufacture of said integrated circuit device.

16. The method according to claim 15 further comprising over-etching said permanent sidewall spacers to a reduced thickness after said step of implanting ions into exposed said semiconductor substrate to form said heavily doped junctions and before said step of depositing said metal layer.

17. The method according to claim 15 wherein said capping layer comprises one of the group of: W, Ta, TiN, TaN, metal oxide, and metal nitride.

18. The method according to claim 15 wherein said step of irradiating is performed using a laser light with a fluence of between about 0.1 Joules/cm$^2$ and 1.5 Joules/cm$^2$ and a wavelength of between about 157 nanometers and 308 nanometers.

19. The method according to claim 14 wherein said step of implanting ions into exposed said semiconductor substrate to form an amorphous layer comprises implanting one of the group of: Si and Ge, wherein said implantation is performed at an energy of between about 1 KeV and 50 KeV and a dosage of between about $1 \times 10^{15}$ atoms/cm$^2$ and $1 \times 10^{16}$ atoms/cm$^2$.

20. The method according to claim 14 wherein said metal layer comprises one of the group of: Ti, Co, Ni, and Ni—Pt alloy.

* * * * *

UNITED STATES PATENT AND TRADEMARK OFFICE
CERTIFICATE OF CORRECTION

PATENT NO. : 6,335,253 B1
DATED : January 1, 2002
INVENTOR(S) : Yung Fu Chong, Kin Leong Pey, Alex See, and Andrew Thye Shen Wee It is certified that error appears in the above-identified patent and that said Letters Patent is hereby corrected as shown below:

<u>Title page,</u>
Please add Item -- [74], *Attorney, Agent or Firm* - George O. Saile;
Rosemary L.S. Pike --

Signed and Sealed this

Fourth Day of June, 2002

Attest:

Attesting Officer

JAMES E. ROGAN
*Director of the United States Patent and Trademark Office*